US007368836B2

(12) United States Patent
Kammeter et al.

(10) Patent No.: US 7,368,836 B2
(45) Date of Patent: May 6, 2008

(54) VOLT-SECOND SYNCHRONIZATION FOR MAGNETIC LOADS

(75) Inventors: John B. Kammeter, Richmond, VA (US); Vernon Lee Stant, Richmond, VA (US); Gregory Scott Schlueter, Highland Springs, VA (US)

(73) Assignee: Power Distribution, Inc., Sandston, VA (US)

( * ) Notice: Subject to any disclaimer, the term of this patent is extended or adjusted under 35 U.S.C. 154(b) by 331 days.

(21) Appl. No.: 11/094,222

(22) Filed: Mar. 31, 2005

(65) Prior Publication Data

US 2006/0226818 A1 Oct. 12, 2006

(51) Int. Cl.
*G11C 13/02* (2006.01)

(52) U.S. Cl. ........................................ 307/415; 307/43

(58) Field of Classification Search ................ 307/415, 307/145, 43

See application file for complete search history.

(56) References Cited

U.S. PATENT DOCUMENTS 3,662,182 A 5/1972 Ullmann et al. .............. 307/64
4,528,494 A 7/1985 Bloomer ..................... 323/237
4,622,513 A 11/1986 Stich .......................... 323/343
4,761,563 A 8/1988 Ross et al. ..................... 307/87
5,182,464 A 1/1993 Woodworth et al. .......... 307/87
5,386,147 A 1/1995 Bonneau et al. .............. 307/64
5,814,904 A 9/1998 Galm ......................... 307/130
5,881,215 A 3/1999 Alft ........................... 395/182
6,317,346 B1 11/2001 Early .......................... 363/65
6,542,023 B1 4/2003 Daun-Lindberg et al. ... 327/460
2003/0095421 A1 5/2003 Kadatskyy et al.
2004/0172204 A1 9/2004 Eaton et al.
2006/0006742 A1* 1/2006 Galm .......................... 307/87

OTHER PUBLICATIONS

Cubus, Inrush Current In A Transformer, [www] chataboutelectronicequipment.com, Dec. 31, 2003.
Chen et al., A New Low-Stress Buck-Boost Converter For Universal-Input PFC Applications:, Colorado Power Electronics Center, Date unknown.
Rauck, "Converter Flux Walking", Creative Power Resources, Inc., Downloaded Dec. 7, 2004.

* cited by examiner

*Primary Examiner*—Michael Sherry
*Assistant Examiner*—Carlos Amaya
(74) *Attorney, Agent, or Firm*—Bacon & Thomas, PLLC

(57) ABSTRACT

A method and device for connecting a load to an AC power source is arranged to ensure that the volt-second ratings of magnetic devices in the load are not exceeded, in order to limit in-rush currents resulting from saturation of the magnetic devices. In the case where the load is being disconnected from a first AC source and connected to a second AC source, the volt-seconds of the load can be measured and/or calculated during disconnect, in order to delay connection of the load to the second AC source by an amount sufficient to prevent saturation of magnetic devices and thereby ensure volt-second synchronization of the sources.

26 Claims, 7 Drawing Sheets

Fig. 3
180.0
30.0 V/div
-180.0
AN Volts
180.0
30.0 V/div
-180.0
BN Volts
180.0
30.0 V/div
-180.0
CN Volts
2100.0
575.0 A/div
-200.0
A Amps
1400.0
400.0 A/div
-200.0
B Amps
1600.0
450.0 A/div
-200.0
C Amps
-75.000 ms
0.0
124.900 ms
Scans In View 2000
Pre-trigger Timebase 10.000 ms/div
Post-trigger Timebase 10.000 ms/div

VOLT-SECOND SYNCHRONIZATION FOR MAGNETIC LOADS

BACKGROUND OF THE INVENTION

1. Field of the Invention

This invention relates to a method of connecting a load to an AC power source or sources, and in particular to a load connection method in which the load is connected to the AC power source based on the magnetic saturation characteristics, in volt-seconds, of the load, thereby minimizing the current in-rush caused by reduced impedance due to saturation of magnetic constituents of the load during connection.

The invention also relates to a load disconnect/reconnect method in which the magnetic saturation characteristics of the load are measured or determined during disconnection of the load from a first AC power source, and used to minimize in-rush current during re-connection of the load to a second AC power source.

Finally, the invention relates to devices that implement the above-mentioned volt-second based connection and disconnect/reconnect methods.

2. Description of Related Art

The use of static or electro-mechanical devices to achieve phase synchronization when disconnecting from and reconnecting to AC power sources has made a considerable contribution to the power quality and reliability in critical IT, MIS, and communications facilities. However, one problem that is not solved by current phase synchronization devices is the inability of the distribution system to survive the high initial influx of current drawn by down stream transformers and other magnetic devices when they saturate. This initial influx of current can trip upstream protective devices and/or initiate bypass in an upstream UPS.

The performance of transformers and other magnetic devices is defined by their B-H curve. The axes of the B-H curve are flux density (B) and magnetic field intensity (H). The flux density is the integral of the applied voltage and is therefore proportional to the volt-seconds of the applied voltage. The magnetic field intensity is proportional to the current.

The relationship between B and H is determined by the permeability of the magnetic device and this relationship is generally non-linear. The slope of the B-H curve is inductance. At high levels of flux density (volt-seconds) the B-H curve flattens causing the slope of the B-H curve to approach zero. The knee of the curve is where the curve starts to flatten and the device core starts to saturate, i.e., the part at which increases in the input voltage do not increase the secondary voltage proportionally.

If the applied volt-seconds exceed the rated volt-seconds for a ½ cycle interval, or if there is a volt-second off-set, the core saturates, the device impedance is reduced (core saturation), and large current flows in the power system.

When a magnetic device is disconnected and connected between two power sources that are out of phase, the applied volt-seconds can be twice the rated volt-seconds, causing a large influx of current. The current in-rush can be up to 12 times the rated full load input current for the first half cycle. Only the source impedance and the magnetic device winding resistance and leakage impedance will limit the current, and typically the upstream protective devices(s) will trip or open and cause the loss of the critical loads supported by the transformer.

SUMMARY OF THE INVENTION

It is accordingly an objective of the invention to provide a method of connecting a load to an AC power source that ensures that the volt-second ratings of magnetic devices in the load are not exceeded, and that therefore limits in-rush currents resulting from saturation of the magnetic devices.

It is a second objective of the invention to provide a method of connecting a load to an AC power source that involves disconnecting the load from a first AC power source and delaying the reconnection of the load to a second AC power source so as to achieve phase synchronization, and yet that does not exceed the volt-second rating of magnetic devices in the load.

It is a third objective of the invention to provide a method of re-connecting a magnetic load to an AC source in which the current influx for the first half cycle can be reduced to 1.25 times rated full load rather than the conventional current influx of up to 12 times the rated full load input current.

It is a fourth objective of the invention to carry out phase and volt-second synchronization between a disconnecting power source and a connecting AC power source in a manner that is transparent to the load.

It is a fifth objective of the invention to provide a method of re-connecting a magnetic load to an AC source following random disconnection of the magnetic device from the source without any knowledge of the applied volt-seconds before disconnection, or a method of initially connecting the magnetic load to the AC source, without high influx of current.

It is a sixth objective of the invention to provide connect devices, transfer switches, and/or disconnect/re-connect devices that utilizes the above-described method.

These objectives are accomplished, in the accordance with the principles of a preferred embodiment of the invention, by a method of connecting an AC power source to a load in which the connection is accomplished over an interval that takes into account volt-second characteristics of a load. In the case of a load connect/disconnect device or transfer switch, the preferred embodiment carries out both phase synchronization and volt-second synchronization of the source to the load, the re-connection of the load to the AC power source being based on a volt-second determination made during disconnection of the load from a first AC power source.

In order to ensure that the volt-seconds synchronization in the disconnect-reconnect transition is carried out so as make the transition transparent to the load in static devices, the disconnect-reconnect transition outage should be less than ½ cycle of the base frequency, and the influx of current should not exceed 125% of rated current. To be load transparent in mechanical devices, the disconnect-reconnect transition should not increase the normal transition time by more than ½ cycle of the base frequency.

In accordance with the principles of an especially preferred embodiment of the invention, the volt-second synchronization takes no more than three ½ cycles of the reconnecting source, and is carried out according to the following method:

- Assuming that the load is to be disconnected from source S1 and is reconnected to source S2, first measure or calculate the volt-seconds VSd from the disconnecting source last ½ cycle cross-over to the point of load disconnection;
- Based on the measured or calculated volt-seconds, calculate delay intervals of up to three ½ cycles of the second source to complete the synchronization of the second AC power source to the first AC power source;

Gate semiconductor devices into conduction or close mechanical contacts at the end of the calculated delay intervals following disconnection from the first AC power source.

The delay intervals of the preferred method may be established by calculating three delay times Td1, Td2, and Td3 based on the equality VSd+VSc1+VSc2+VSc3=2*Aoc/Wc, as follows:

Td1 is the delay from the load disconnection point to reconnection during the first ½ cycle of the connecting source that occurs after disconnection. This time determines VSc1.

Td2 is the delay from the load disconnection to reconnection in the second ½ cycle of the connecting source that occurs after disconnection. This time determines VSc2.

Td3 is the delay from the first crossover of the third ½ cycle to reconnection in the third ½ cycle of the connecting source that occurs after disconnection. This time determines VSc3.

VSc1=volt-seconds of the first ½ cycle of the connecting source after load reconnection to the end of the ½ cycle. VSc1 has a positive sign if the voltage is positive.

VSc2=volt-seconds of the second ½ cycle of the connecting source after load reconnection to the end of the ½ cycle. VSc2 has a positive sign if the voltage is positive.

VSc3=volt-seconds of the third ½ cycle of the connecting source after load reconnection to the end of the ½ cycle. VSc3 has a positive sign if the voltage is positive.

Aoc=The peak value, in volts, of the sine wave form of the connecting source.

Wc=omega=2*(PI)*Foc; Foc=connecting source frequency.

Aod=The peak value, in volts, of the sine wave form of the disconnecting source.

Wd=omega=2*(PI)*Fod; Fod=disconnecting source frequency.

In the situation when a magnetic device is randomly disconnected from a source without any knowledge of the applied volt-seconds before disconnection, reconnection of the load to the source is preferably carried out so that there is only 5% of the rated ½ cycle volt-seconds applied for the first two ½ cycles. After the first two ½ cycles, 5% more volt-seconds is added for each subsequence two ½ cycles. After 20 cycles the applied volt-seconds will be 100%. Since all magnetic device have at least a % 5 over voltage rating, 5% added volt-seconds will not exceed the over voltage volt-seconds rating.

The invention may use any of the following categories of semiconductor devices:

Category 1 Load disconnect-reconnect devices using semiconductors that can be gated into conduction with a pulse or level applied to the semiconductor gate/base and that will remain conducting until the pulses and/or level stops and an external mechanism reduces the current flowing though the semi-conductor to a specified small value, generally approaching zero current. Time increments of ½ cycles are used in the text to allow the use of Category 1 devices that may take part of the next ½ cycle to disconnect after the applied voltage zero cross over. Typically the devices take ⅙ of a cycle to disconnect after the applied voltage zero cross over.

Category 2 Load disconnect-reconnect devices using semiconductors that can be gated into conduction with a pulse applied to the semi-conductor and that will remain conducting until a second pulses stops conduction, with no external mechanism required to reduces the current flowing though the semiconductor.

Category 3 Load disconnect-reconnect devices using semiconductors that can be gated into conduction with a voltage level applied to the semi-conductor and that will remain conducting until the voltage level is removed.

In addition to application to semiconductor devices, the method of the invention may also be applied to mechanical disconnect re-connect systems including electro-mechanical devices that use contacts to disconnect and reconnect the load, although it will be appreciated by those skilled in the art that the algorithm defined in this invention only applies to electromechanical devices that can disconnect the load and hold in a center state for a specified delay and then reconnect.

DETAILED DESCRIPTION OF THE PREFERRED EMBODIMENTS

Figure 1:
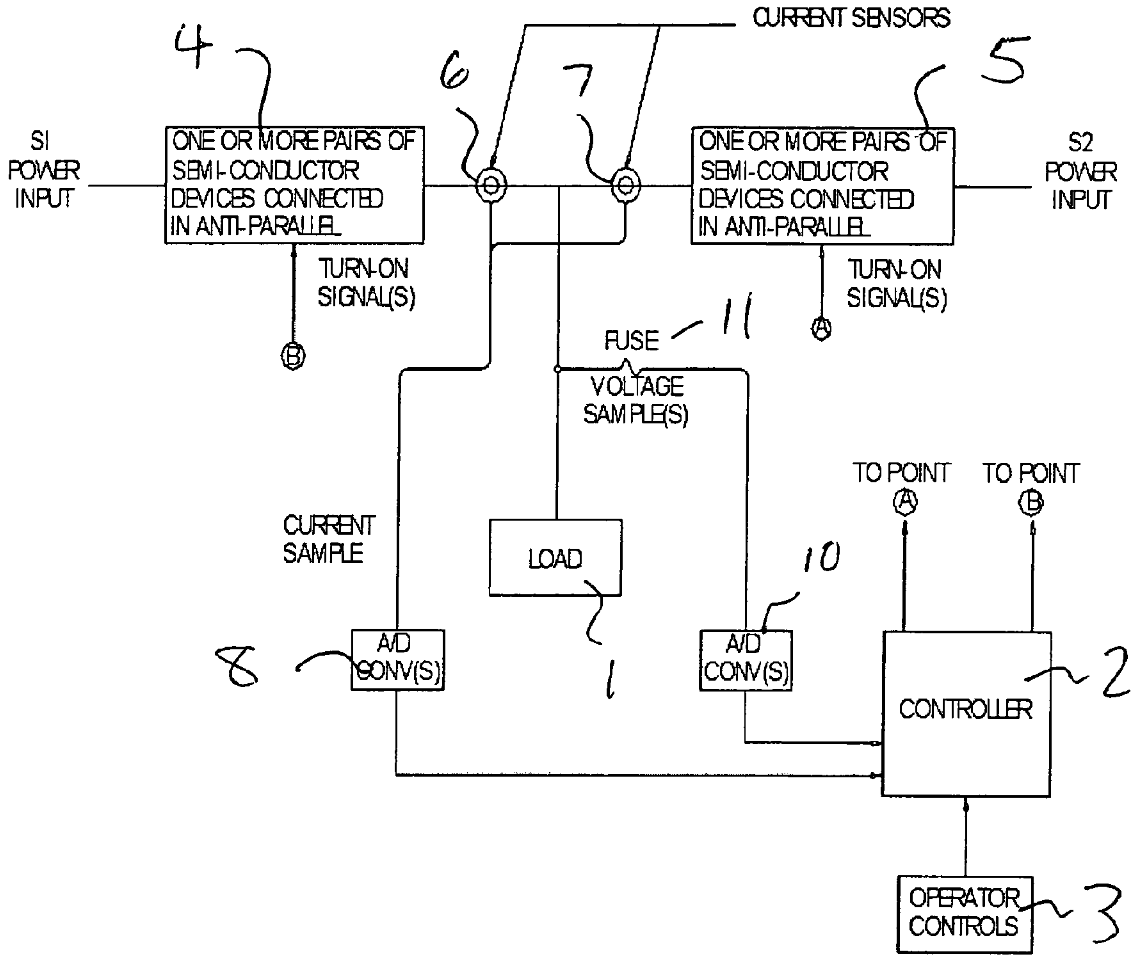
FIG. 1 is a block diagram of a single or multiple phase static disconnect-reconnect system that can utilize the volt-second synchronization method of the invention.

FIG. 1 shows a static disconnect-reconnect system to which the method of the invention may be applied. Those skilled in the art will appreciate that the system illustrated in FIG. 1 is exemplary in nature only, and that the method of the invention may be applied to a variety of transfer switches and disconnect/reconnect devices.

The system illustrated in FIG. 1 respectively disconnects load 1 from AC power source S1 and re-connects it to AC power source S2. It includes a digital controller 2, operator controls 3, switching circuitry 4 controlled by signals received from the controller 2 and including one or more pairs of semi-conductor devices connected in anti-parallel, switching circuitry 5 also consisting of one or more pairs of semi-conductor devices connected in anti-parallel and connected to receive control signals from the controller 2. Current sensors 6 and 7 are arranged to sample current output by the respective switching circuits 4 and 5, and to transmit the current sensing signals to the controller 2 via analog-to-digital converter 8. The voltage supplied to the load is preferably detected by analog-to-digital converter 10 via a fuse 11 and also supplied to the controller 2, which controls the semi-conductor devices based on the detected current and voltage samples, and the method described below.

Figure 2:
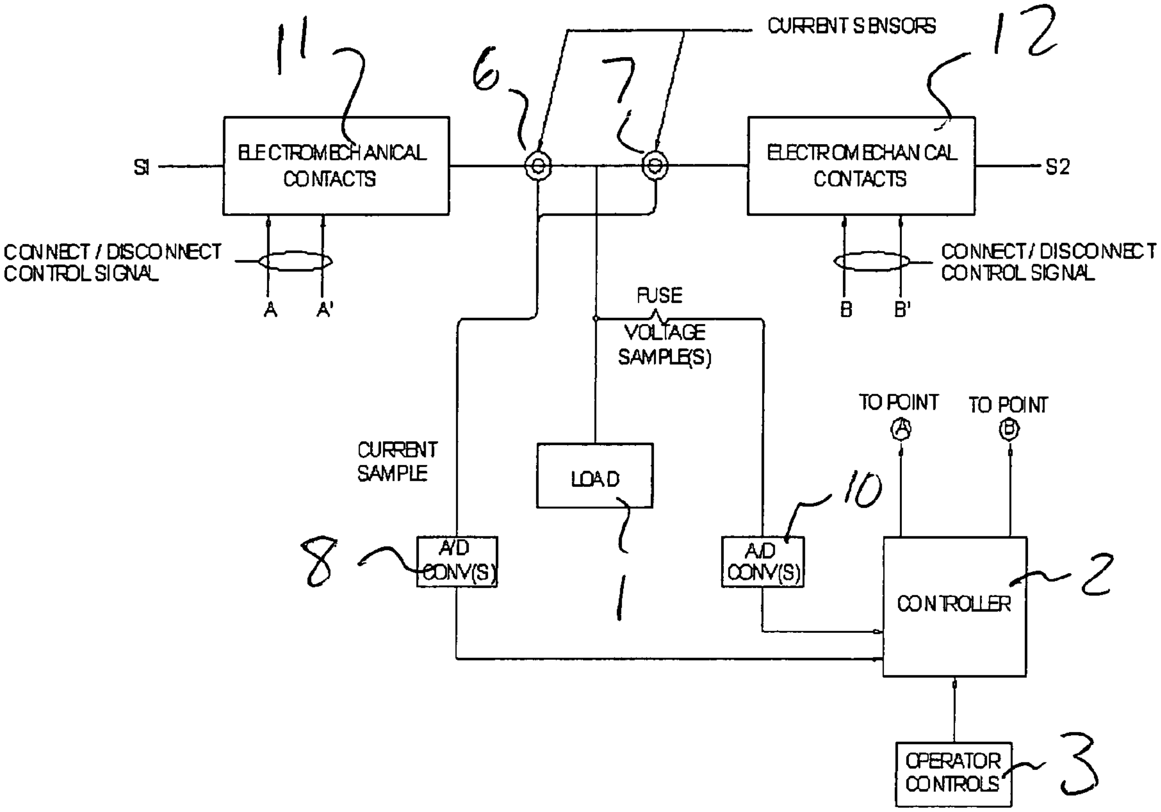
FIG. 2 is a block diagram of a single or multiple phase mechanical disconnect-reconnect system that can utilize the volt-second synchronization method of the invention.

The system illustrated in FIG. 2 is a mechanical disconnect-reconnect system that also can utilize the volt-second synchronizing method of the invention, so long as the electromechanical devices 11 and 12 that replace semi-conductor devices 4,5 of FIG. 1 can disconnect the load and hold in a center state for a specified delay and then reconnect. The controller 2, operator controls 3, current sensors 6,7, analog-to-digital converters 8,10, fuse 11 may be similar to the correspondingly numbered elements shown in FIG. 1, and the method of controlling the controller 2 analogous to that used in connection with the controller of FIG. 1, except as noted below.

Figure 7:
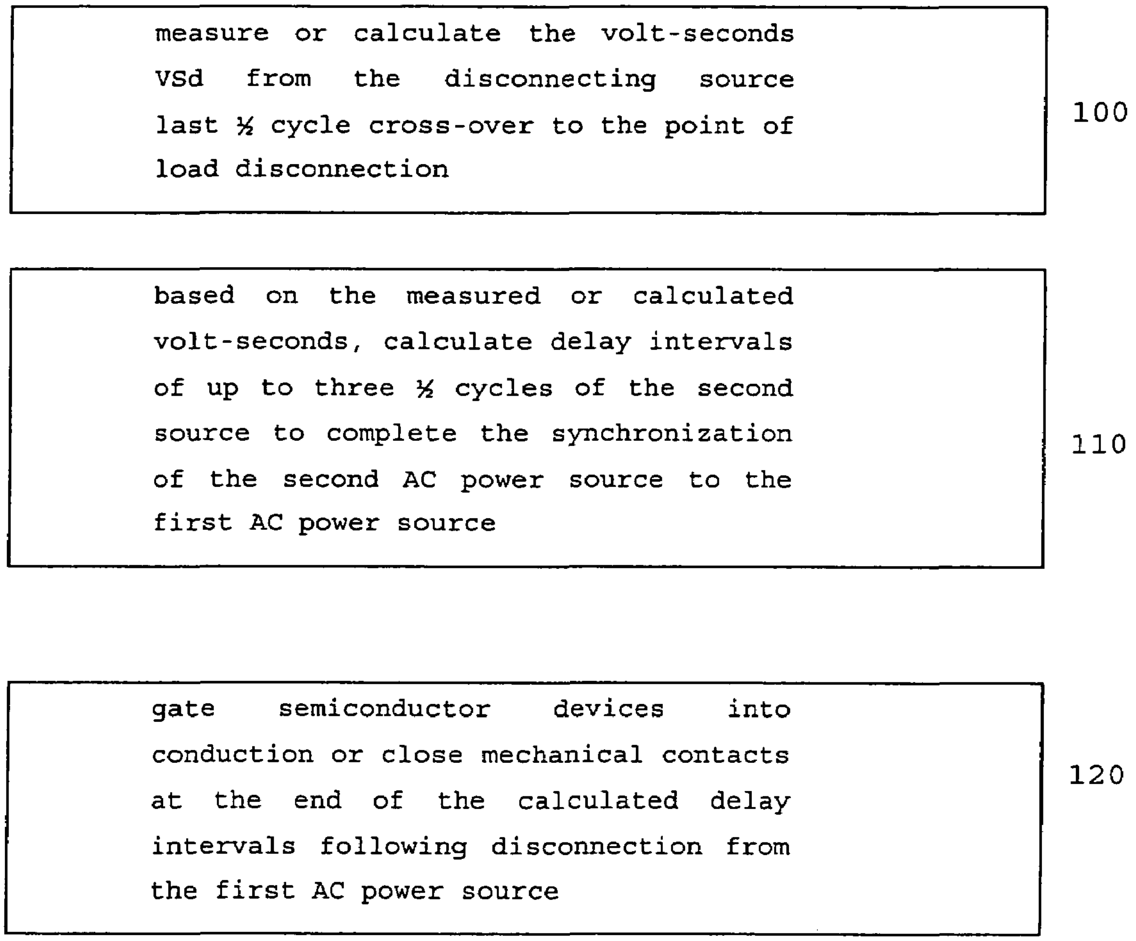
FIG. 7 is a flowchart showing the principal steps of a volt second synchronization method in accordance with the principles of the invention.

FIG. 7 illustrates a method of volt-second synchronization according to the preferred embodiment of the invention, in which the volt-second synchronization will take up to three ½ cycles of the reconnecting source, as follows:

Upon disconnection of the load from source S1, and before reconnection to source S2, the volt-seconds Vsd from the disconnecting source last ½ cycle cross-over to the point of load disconnection is measured or calculated (step 100). VSd has a positive sign if the voltage is positive.

The delay times are then calculated (step 110). It may take three ½ cycles of S2 to complete the synchronization of S2 to S1. The total load outage time for semiconductor devices is ½ cycle or less.

Finally, the semiconductor devices are gated into conduction, or mechanical contacts are closed, based on the calculated delay times.

In a preferred embodiment of the invention, the delay times Td1, Td2, and Td3 are based on the equality VSd+VSc1+VSc2+VSc3=2*Aoc/Wc, where:

Td1 is the delay from the load disconnection point to the reconnection in first ½ cycle of the connecting source that occurs after disconnection, this time determines VSc1.

Td2 is the delay from the load disconnection to the reconnection in second ½ cycle of the connecting source that occurs after disconnection, this time determines VSc2.

Td3 is the delay from the first cross over of the third ½ cycle to the reconnection in third ½ cycle of the connecting source that occurs after disconnection, this time determines VSc3.

VSc1=volt-seconds of the first ½ cycle of the connecting source after load reconnection to the end of the ½ cycle. VSc1 has a positive sign if the voltage is positive and a negative sign if the voltage is negative.

VSc2=volt-seconds of the second ½ cycle of the connecting source after load reconnection to the end of the ½ cycle. VSc2 has a positive sign if the voltage is positive.

VSc3=volt-seconds of the third ½ cycle of the connecting source after load reconnection to the end of the ½ cycle. VSc3 has a positive sign if the voltage is positive.

Aoc=The peak value, in volts, of the sine wave form of the connecting source

Wc=omega=2*(PI)*Foc; Foc=connecting source frequency

Aod=The peak value, in volts, of the sine wave form of the disconnecting source

Wd=omega=2*(PI)*Fod; Fod=disconnecting source frequency

In the above-described method, volt-second synchronization is based on the summing of the positive and negative ½ cycles, with volt-seconds being synchronized during the total disconnect and reconnect transition. The lowest transition time is based on reconnection as quickly as possible after disconnection.

Of course, the above method of determining the delay times may be modified by using appropriate approximations, since the general algorithm for synchronization for producing low influx current can require a large amount of controller processing time. Approximations which do not require large amount of controller processing time are described below in connection with various specific implementation examples.

The three steps illustrated in FIG. 7 will now be described in more detail:

1. Calculation or Measurement of Volt-Seconds During Disconnection (Step 100)

The volt-seconds applied to the magnetic load during the half cycle before load disconnection may be measured or calculated by using current sensors 6,7 to determine the direction of the current, voltage samples obtained by A/D converters 8,10 to measure Aod and Wd and the various time periods, and the following calculation of the volt-seconds Vsd as follows:

$$VSd=Aod/Wd*(-\cos(Wd*\text{Finish time})+\cos(Wd*\text{start time}))$$

Aod=the peak value, in volts, of the sine wave form of the disconnecting source

Wd=omega=2*(pi)*Fod; Fod=disconnecting source frequency.

In this implementation, the volt-seconds VSd of a partial ½ cycle of a sine wave from initial zero cross-over to Tdis1 can be calculated as follows:

$$VSd=Aod/Wd*(-\cos(Wd*Tdis1)+\cos(0))+VSde=Aod/Wd*(-\cos(Wd*Tdis1)+1)+VSde \quad \text{(Eq. 1)}$$

Where:

Tdis1=is the time from the initial ½ cycle zero cross-over to the load disconnection point. This time is data generated and stored by the controller.

VSde=the error due to measurement or calculation which is somewhere constant and can be found by controller learning algorithms. Look-up tables can be used if VSde is not constant.

The S1 volt-seconds must be normalized to S2 volt-seconds with respect to differences in Aox and Wx amplitudes. (Eq. 2)

$$VSdn=(Aoc/Aod)*(Fod/Foc)*VSd \quad \text{(Eq. 3)}$$

a. Aod=peak amplitude of the connecting source b. Foc=Frequency of connecting source c. VSdn=normalized VSd Alternatively, the controller 2 can sample the ½ cycle voltage wave from cross-over to time Tdis1 and then calculate the volt-seconds. The sampled voltage is the instantaneous sum of the winding(s) voltage on the respective phase, as follows (the number of samples in the ½ cycles and the a/d converter will determine the accuracy):

$$VSd = \text{volt-seconds} = \text{Tint} * \{\Sigma V_1 + (V_2 + V_3)/2 + \ldots (V_{n-1} + V_n)/2\} + Vsde, \quad \text{(Eq. 4)}$$

Tint=sampling interval in seconds $V_1$, $V_2$ . . . $V_n$=Sampled voltage amplitudes VSde=The error due to measurement or calculation which is somewhere constant and can be stored by controller learning algorithms. Look-up tables can be used if VSde is not constant The S1 volt-seconds must be normalized to S2 volt-seconds with respect to differences in Aox and Wx amplitudes. (Eq. 5)

$$VSdn = (Aoc/Aod) * (Fod/Foc) * VSd \quad \text{(Eq. 6)}$$

d. Aod=peak amplitude of the connecting source e. Foc=Frequency of connecting source f. VSdn=normalized VSd 2. Calculation of Delay Times (Step 110)

The delay time calculations will be affected by the different types of systems to which the principles of the invention may be applied. Accordingly, the following description of the delay time calculation method includes several different cases:

CASE 1—General algorithms to reduce influx current for a single phase of a multi-phase system or for a single phase system.

a. connecting source leads the disconnecting source, semiconductor devices

In this case the time delays for the first three ½ cycles of the load reconnection are is given by the following:

$$VSdn + VSc1 - VSc2 + VSc3 = 2 * Aoc/Wc, \quad \text{(Eq. 7)}$$

where:

a. Wc=omega=2*(pi)*Foc; Foc=connecting source frequency;

b. VSdn and VSc1 and VSc3 have the same sign; VSc2 has the opposite sign;

c. VSdn is measured or calculated as shown above;

d. VSc1 should be as large as possible, i.e., Td1=0, so that the S2 semiconductors are gated on as quickly as possible after the S1 semiconductors are gated off; and e. For values of Tdis1>=1/(2*Fod)−Tps, Td1 is ignored and VSc1=0 [where Tps=(phase shift betw sources)/(2*PI ( )*Fo)].

Since category 1 semiconductors stop conducting when the load current decreases below holding current and due to a non-unity power factor, the cross-over point of the voltage waveform and the crossover point of the current waveforms do not coincide. Tdis2 is the time at which the category 1 semiconductors stop conducting the second ½ cycle after being gated "on" in the first ½ cycle. Other categories of semiconductor categories can be gated off at the cross-over point in the voltage wave form.

$Td3 = (1/Wc) * A\text{Cos}\ [(Wc/Aoc) * (VSc3) - 1]$; to keep transition times short; Td3 should equal zero; thus $VSc3 = 2 * Aoc/Wc$. (Eq. 8)

$$VSc2 = -[2 * Aoc/Wc.] + \{VSdn + VSc1 + VSc3\} \quad \text{(Eq. 9)}$$

$$VSc2 = Aod/Wd * (-\cos(Wc * Tdis2) + \cos(Wc * Tx) + 2);\ Tx = Tps + Tdis + Td2 - 0.5/Foc \quad \text{(Eq. 10)}$$

a. Cos (Tdis2)=1 for all categories of semiconductor except category 1.

$$Tx = (1/W2) * A\text{Cos}\ [(W2/Ao2) * VSc2 - 2 + \cos(Wc * Tdis2)]. \quad \text{(Eq. 11)}$$

$$Td2 = Tx + 0.5/Foc - Tps - Tdis. \quad \text{(Eq. 12)}$$

If $VSdn + VSc1 - VSc2 + VSc3 > 2 * Aoc/Wc$, then Td3 cannot be equal to zero, for full conduction of the third ½ cycle, and Td3 can be calculated using the methods above. (Eq. 13)

When Tdis1>=[Tav/(4)]−[Tps/2] to Tdis1<=[1/(Fod*2)]−[Tps/2], the load outage time is <=1/[Tav/2], (8.33 Ms for 60 Hz) and equation 12 reduces to equation 14, in which Td1 can be ignored; there is no reconnect in the first ½ cycle of connecting source, Td3 is ignored i.e. VSc3=2*Aoc/Woc; and full conduction occurs during all of the third ½ cycle:

$$Td2 = Tav - 2 * Tdis1 - Tps, \quad \text{(Eq. 14)}$$

where:

Td2=the time delay in seconds from load disconnect (Tdis1) time to load reconnect time;

The load will be reconnected to the connecting source in the second ½ cycle of the connecting source, and therefore VSc1=0;

Foc=frequency of connecting source;

Tdis1 =load disconnect time in seconds measured from cross-over of the ½ cycle to actual load disconnect; and Tav=[1/(2*Fod)+1/(2*Foc)].

When Tdis1<=[Tav/(4)]−[Tps/2] or Tdis1>=[1/(Fod*2)]−[Tps/2] and equation 12 is used to determine Td2. Equation 14 can allow load outage times up to Tav seconds (16.66 Ms for 60 Hz) when the phase shifts between sources is small. Outages longer than Tav/2 seconds generally cannot be tolerated.

In order to decrease load outage time, equations 8 to 12 must be used. The controller can solve the equations directly or look-up tables can be used.

b. Connecting Source Lags the Disconnecting Source, Semiconductor Devices

In this case, Td1 is ignored, there is no reconnect in the first ½ cycle of connecting source, and:

$$\text{Td2} = \text{Tps} \quad \text{(Eq. 15)}$$

Td1 and Td3 are assigned values to ensure no conduction in first ½ cycle of S2 and full conduction of third ½ cycle of S2.

The application of equation 15 will result in transition times<=[T/2]; (<=8.333 Ms for Fo=60 Hz). If shorter transistion times are desired, equation 7 can be used.

CASE 2—low values of phase shift between the disconnecting source and the connecting source; high speed disconnect-reconnect time i.e., semiconductor devices a. If the connecting source lags the disconnecting source by 15 degrees or less, a 2-4 millisecond transition time between disconnection and reconnection to another source will typically reduce the influx current of a standard magnetic load from X15 to an X1.25 influx of current after reconnection, which is generally an acceptable current influx rating.

b. Similarly, if the connecting source leads the disconnecting source by 8 degrees or less, a 2-4 millisecond transition time between disconnection and reconnection to another source will typically give a X1.25 influx of current after reconnection, which is generally an acceptable current influx rating This case can not be used with electro-mechanical devices, due to the fast transition times required.

CASE 3—Electro-mechanical devices to disconnect and reconnect the load to S1 and S2.

Electro-mechanical devices typically use contacts to disconnect and reconnect sources to a load. The device must be capable of disconnecting the load, holding the load disconnected from S1 for a determined length time (center-delay) and then reconnect the load to S2.

The volt-seconds applied to the magnetic load during the ½ cycle before load disconnection can be measured or calculated using equation 1 or 2 above.

Since the time required to disconnect or reconnect the load in an electromechanical device is many times the sub-cycle delay time require for volt-seconds synchronization, the controller must measure and store certain device parameters so that disconnect and reconnect times can be predicted.

The following parameters must be recorded and stored for each disconnect and reconnect period:

Applied connect and disconnect voltage

Temperature

Number of disconnects and reconnects

Power factor of the load

During factory testing the voltage and power factor can be varied so the controller with have initial knowledge.

a. If the connecting source lags the disconnecting source for electromechanical devices meeting the above conditions:

$$Td2=N+Tps, \quad \text{(Eq. 16)}$$

where

N=an integer>=the number of S2 cycles required to reconnect the load. The controller predicts N based on measured parameters b. If the connecting source leads the disconnecting source:

$$Td2=N+Tps+(1/fc)-(2*Tdis1), \quad \text{(Eq. 17)}$$

where

N=an integer>=the number of S2 cycles required to reconnect the load. The controller predicts N based on measured parameters.

3. Re-Synchronization (Step 120)

When the volt-seconds before disconnect can be measured or calculated, re-synchronization simply involves connecting the second power source after the appropriate delay time, as indicated above. However, when a magnetic device is randomly disconnected from a source without any knowledge of the applied volt-seconds before disconnection, minimization of the in-rush current is preferably accomplished by reconnection of the load to the source so that there is only 5% of the rated ½ cycle volt-seconds applied for the first two ½ cycles. After the first two ½ cycles, 5% more volt-seconds is added for each subsequence two ½ cycles. After 20 cycles (40½ cycles) the applied volt-seconds will be 100%. Since all magnetic device have at least a % 5 over voltage rating, 5% added volt-seconds with exceed the over voltage volt-seconds rating. This procedure again uses the following parameters:

VSrs=Aoc/Wc*(−cos (Finish time)+cos (start time)); VSrs=volt-seconds of an ½ cycle sine wave Aoc=the peak value, in volts, of the sine wave form of the connecting source Wc=omega=2*(pi)*Fc; Fc=connecting source frequency The finish time is 1/(2*Fc); the end of the ½ cycle. Furthermore:

$$VSrs=Aoc/Wc*(1+\cos(Wc*Td)); \text{ Td=delay period from the start of the ½ cycle} \quad \text{(Eq. 18)}$$

VSrs should be N*5%*2*Aoc/Wc; N ranges from 1 to 20 cycles (Eq. 19)

$$Td=1/Wc*A\text{Cos}\,[N*0.1-1] \quad \text{(Eq. 20)}$$

$$Td=1/Wc*A\text{Cos}\,[-0.9]=7.136 \text{ Ms for the first cycle} \quad \text{(Eq. 21)}$$

$$Td=1/Wc*A\text{Cos}(1.8-1)=1.70\ Ms \text{ for the eighteenth cycle} \quad \text{(Eq. 22)}$$

$$Td=0 \text{ for the twentieth cycle} \quad \text{(Eq. 23)}$$

To resynchronize, the controller would calculate or have a look-up table to determine the delay for each cycle from the first full cycle after reconnect is initiated until the load is full reconnected after the twentieth cycle.

EXAMPLES

Figure 3:
FIG. 3 are waveform diagrams showing typical waveforms of a mechanical disconnect-reconnect device without volt-second synchronizaiton.

FIGS. 3 to 6 are waveforms generated during a disconnect/connect cycle for various set-ups, as follows:

FIG. 3 shows typical waveforms of a mechanical disconnect-reconnect device without volt-seconds synchronization and with a 105 decgree phase shift between sources. The peak value of the current waveform before disconnection was 100 amperes, and the peak value at reconnection was 1900 amperes. The top three waveforms in FIG. 3 (AN volts, BN volts, and CN volts) are the three phase primary voltages to a 225 KVA transformer. The bottom three waveforms (A Amps, B Amps, and C Amps) are the line currents to the transformer primary.

Figure 4:
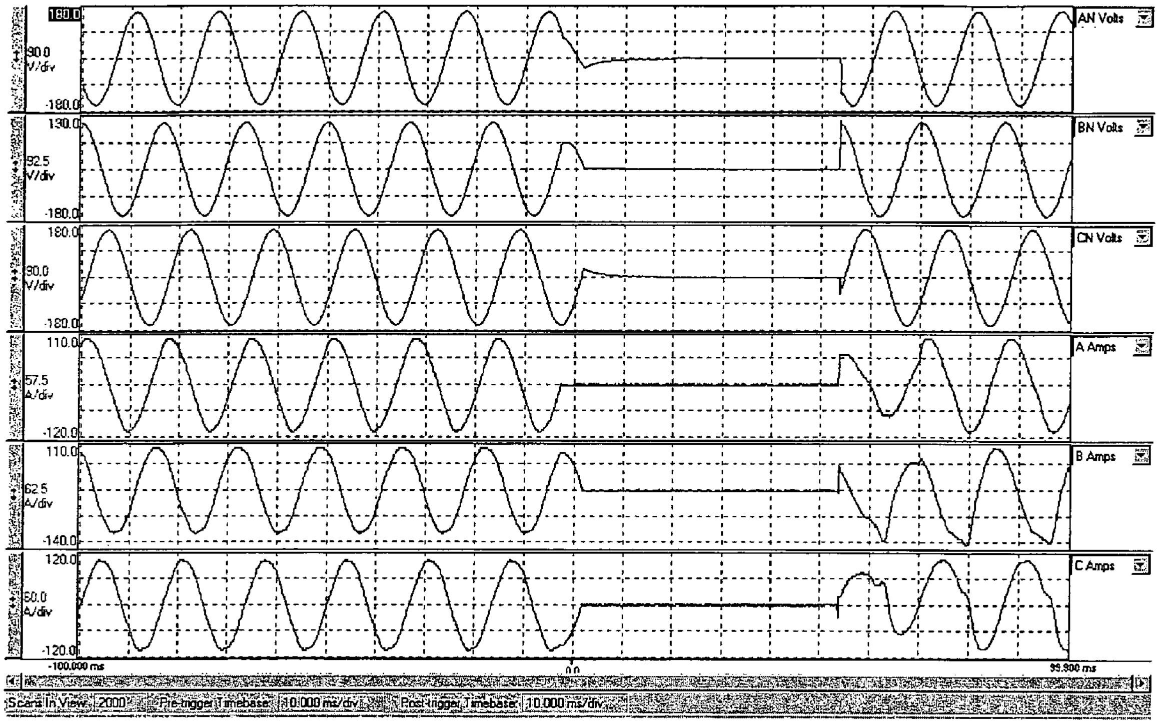
FIG. 4 are waveform diagrams showing waveforms of a mechanical disconnect-reconnect device with volt-second synchronization in accordance with the principles of a preferred embodiment of the invention.

FIG. 4 shows typical waveforms of a mechanical disconnect-reconnect device with volt-seconds synchronization and with a 105 degree phase shift between sources and a normal interval between disconnecting and reconnecting of 50 MS to 60 MS, depending on applied voltage timing. The use of the synchronization method of the ivnention reduced the influx current to approximately zero, i.e., the transformer primary peak current was the same before disconnection and after reconnection. Again, the top three waveforms in FIG. 4 (AN volts, BN volts, and CN volts) are the three phase primary voltages to a 225 KVA transformer. The bottom three waveforms (A Amps, B Amps, and C Amps) are the line currents to the transformer primary.

Figure 5:
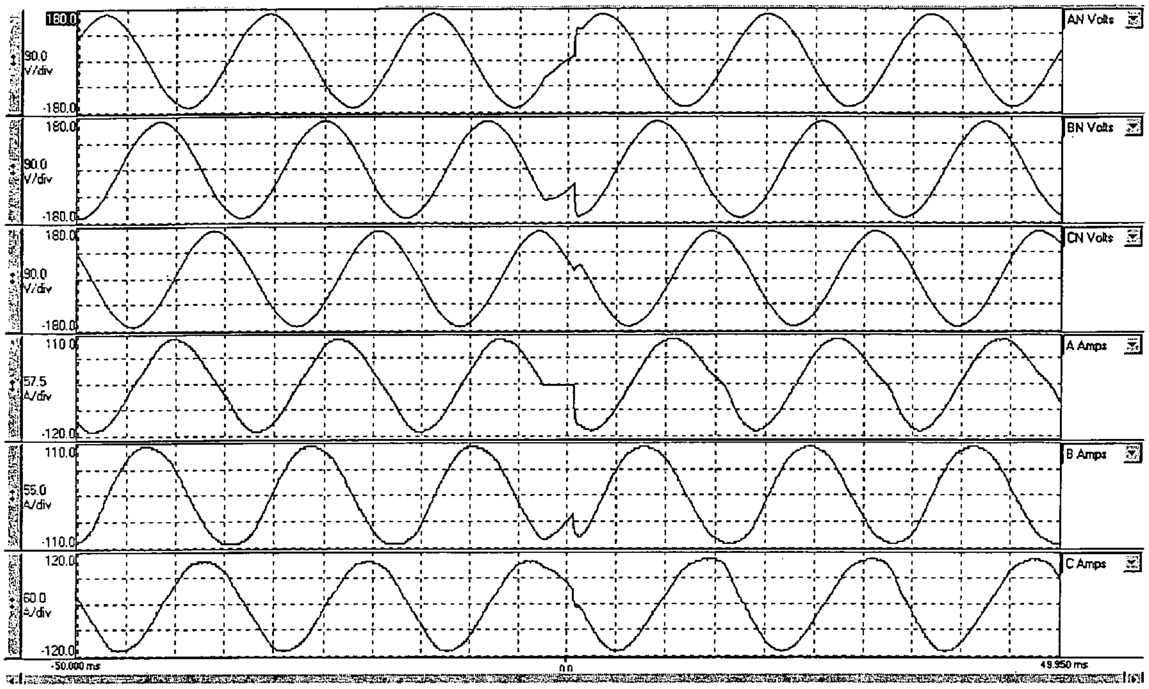
FIG. 5 are waveform diagrams showing typical waveforms of a static disconnect-reconnect device with volt-second synchronization.
Figure 6:
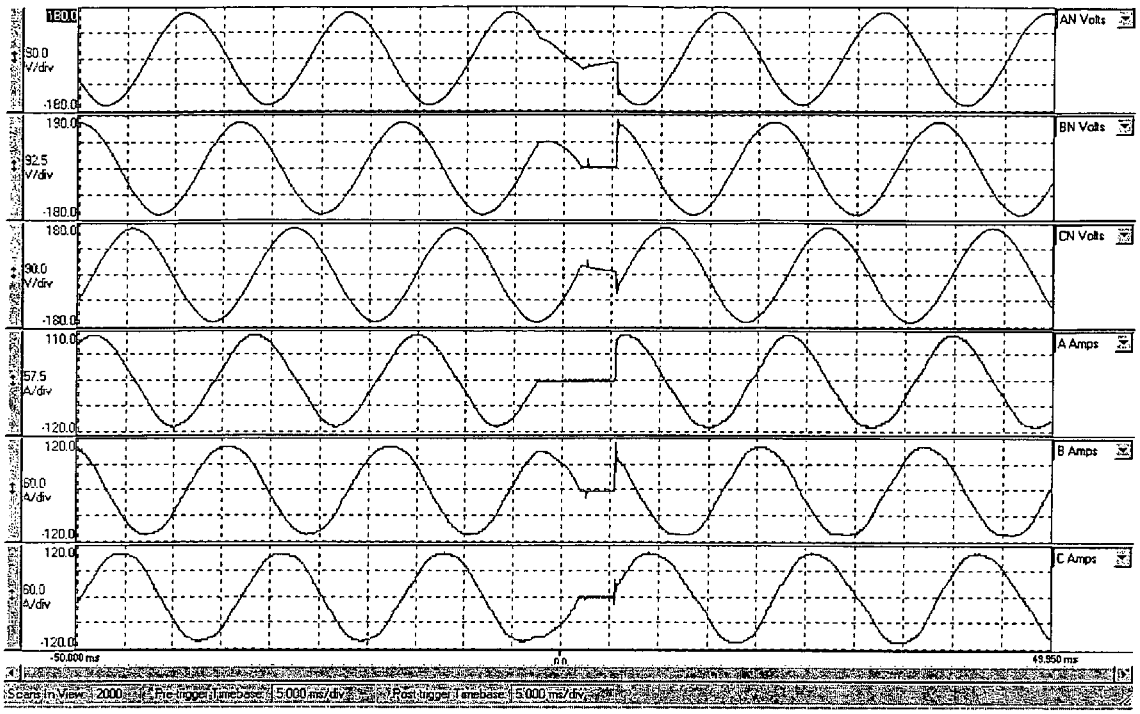
FIG. 6 are waveform diagrams showing waveforms of a static disconnect-reconnect device with volt-second synchronization in accordance with the principles of a preferred embodiment of the invention.

FIG. 5 shows typical waveforms of a static disconnect-reconnect device with volt-seconds synchronization and with a 15 degree phase shift between sources and a normal interval between disconnecting and reconnecting of 2 MS to 4 MS, while FIG. 6 shows typical waveforms of a static disconnect-reconnect device with volt-seconds synchronization, a 105 degree phase shift between sources, and a 3 MS to 7 MS delay. Again, the use of volt-second synchronization reduced the influx current to approximately zero. The top three waveforms in FIGS. 5 and 6 (AN volts, BN volts, and CN volts) are the three phase primary voltages to a 225 KVA transformer. The bottom three waveforms (A Amps, B Amps, and C Amps) are the line currents to the transformer primary.

Having thus described a preferred embodiment of the invention in sufficient detail to enable those skilled in the art to make and use the invention, it will nevertheless be appreciated that numerous variations and modifications of the illustrated embodiment may be made without departing from the spirit of the invention, and it is intended that the invention not be limited by the above description or accompanying drawings, but that it be defined solely in accordance with the appended claims.

We claim:

1. A method of connecting a load to a source, comprising the steps of:

determining delay intervals based on volt-second characteristics of a load; and connecting an AC source to the load following said delay intervals, wherein said load is disconnected from disconnecting source S1 and connected to connecting source S2 after said delay intervals, and wherein said volt-seconds are determined based on current and voltage measurements during disconnection of source S1 from said load, and wherein said volt-seconds are determined, for delay times Td1, Td2, and Td3, according to the equality VSd+VSc1+VSc2+VSc3=2*Aoc/Wc, where:

Td1 is the delay from the load disconnection point to the reconnection in first ½ cycle of the connecting source that occurs after disconnection;

Td2 is the delay from the load disconnection to the reconnection in second ½ cycle of the connecting source that occurs after disconnection;

Td3 is the delay from the first cross over of the third ½ cycle to the reconnection in third ½ cycle of the connecting source that occurs after disconnection;

VSc1=volt-seconds of the first ½ cycle of the connecting source after load reconnection to the end of the ½ cycle;

VSc2=volt-seconds of the second ½ cycle of the connecting source after load reconnection to the end of the ½ cycle;

VSc3=volt-seconds of the third ½ cycle of the connecting source after load reconnection to the end of the ½ cycle;

Aoc=peak value, in volts, of the sine wave form of the connecting source;

Wc=omega=2*(PI)*Foc; Foc=connecting source frequency;

Aod=peak value, in volts, of the sine wave form of the disconnecting source;

Wd=omega=2*(PI)*Fod; Fod=disconnecting source frequency.

2. A method as claimed in claim 1, wherein the step of determining the delay times comprises the step of determining the volt-seconds during the first half cycle before disconnection from a first AC source.

3. A method as claimed in claim 2, wherein a controller samples the ½ cycle voltage wave from cross-over to time Tdis1 and then calculate the volt-seconds, as;

VSd=volt-seconds=Tint*{$\Sigma V_1$+. . . $(V_2+V_3)/2+(V_{n-1}+V_n)/2$}+Vsde, wherein:

Tint=sampling interval in seconds;

$V_1$, $V_2$. . . $V_n$=Sampled voltage amplitudes;

VSde=The error due to measurement or calculation which is somewhere constant and can be stored by controller learning algorithms;

the S1 volt-seconds must be normalized to S2 volt-seconds with respect to differences in Aox and Wx amplitudes; and VSdn=(Aoc/Aod)*(Fod/Foc)*VSd, where a. Aod=peak amplitude of the connecting source;

b. Foc=Frequency of connecting source; and c. VSdn=normalized VSd.

4. A method as claimed in claim 1, wherein the step of determining the volt-seconds during the half cycle before disconnection comprises the steps of using current sensors to determine the direction of the current, voltage samples to measure Aod and Wd and the various time periods, and the following calculation of the volt-seconds VSd:

VSd=Aod/Wd*(−cos (Wd*Finish time)+cos (Wd*start time));

Aod=the peak value, in volts, of the sine wave form of the disconnecting source; and Wd=omega=2*(pi)*Fod; and Fod=disconnecting source frequency.

5. A method as claimed in claim 4, wherein:

VSd=Aod/Wd*(−cos (Wd*Tdis1)+cos (0))+VSde=Aod/Wd*(−cos (Wd*Tdis1)+1)+Vsde, and wherein:

Tdis1=is the time from the initial ½ cycle zero cross-over to the load disconnection point;

VSde=the error due to measurement or calculation.

6. A method as claimed in claim 1, wherein connecting source S2 leads disconnecting source S1, the step of connecting source S2 comprises the step of gating semiconductor devices, and time delays for the first three half cycles of the load reconnection are calculated as follows:

VSdn+VSc1−VSc2+VSc3=2*Aoc/Wc, where:

VSc1=volt-seconds of the first ½ cycle of the connecting source after load reconnection to the end of the ½ cycle;

VSc2=volt-seconds of the second ½ cycle of the connecting source after load reconnection to the end of the ½ cycle;

VSc3=volt-seconds of the third ½ cycle of the connecting source after load reconnection to the end of the ½ cycle;

Aoc=peak value, in volts, of the sine wave form of the connecting source;

Wc=omega=2*(PI)*Foc; Foc=connecting source frequency.

7. A method as claimed in claim 6, wherein Wc=omega=2*(pi)*Foc, where Foc=connecting source frequency.

8. A method as claimed in claim 6, wherein VSdn, VSc1, nd VSc3 have the same sign and VSc2 has an opposite sign.

9. A method as claimed in claim 6, wherein Td1=0, so that semiconductors used to connect source S2 are gated on as quickly as possible after semiconductors used to connect source S1 are gated off.

10. A method as claimed in claim 6, wherein for values of Tdis1>=1/(2*Fod)−Tps, Td1 is ignored and VSc1=0, where Tps=(phase shift betw sources)/(2*PI()*Fo).

11. A method as claimed in claim 6, Td3=(1/Wc)*ACos [(Wc/Aoc)*(VSc3−1] and, to keep transition times short, Td3 should equal zero so that VSc3=2*Aoc/Wc.

12. A method as claimed in claim 6, wherein:

VSc2=−[2*Aoc/Wc.]+{VSdn+VSc1+VSc3};

VSc2=Aod/Wd*(−cos(Wc*Tdis2)+cos(Wc*Tx)+2); and Tx=Tps+Tdis+Td2−0.5/Foc.

13. A method as claimed in claim 12, wherein Cos (Tdis2)= 1 for all categories of semiconductor except those that remain conducting until pulses and/or level stops and an external mechanism reduces current flowing though the semi-conductor to a specified small value.

14. A method as claimed in claim 12, wherein Tx=(1/W2)*ACos[(W2/Ao2)*VSc2−2+cos(Wc*Tdis2)], and Td2=Tx+0.5/Foc−Tps−Tdis.

15. A method as claimed in claim 1, wherein source S2 lags source S1, the step of connecting source S2 comprises the step of gating semiconductor devices, there is no reconnect in the first half cycle of the connecting source, and time delays Td1 and Td3 are assigned values to ensure no conduction in a first half cycle of source S2 and full conduction in a third half cycle of S2.

16. A method as claimed in claim 1, wherein, for low values of phase shift between source S1 and S2 and a high-speed connect-disconnect time, if the connecting source S2 lags the disconnecting source S1 by 15 degrees or less, a 2 to 4 millisecond transition time between disconnection and reconnection is applied.

17. A method as claimed in claim 1, wherein, for low values of phase shift between source S1 and S2 and a high-speed connect-disconnect time, if the connecting source S2 leads the disconnecting source S1 by 8 degrees or less, a 2 to 4 millisecond transition time between disconnection and reconnection is applied.

18. A method as claimed in claim 1, wherein the step of connecting source S2 comprises the step of controlling electro-mechanical switching devices capable of disconnecting from source S1 for a predetermined length of time, holding the load disconnected for said time intervals, and then reconnecting to source S2, and wherein said controller is arranged to store device parameters so that disconnect and reconnect times can be predicted.

19. A method as claimed in claim 18, wherein the following parameters are recorded and stored for each disconnect and reconnect period:

Applied connect and disconnect voltage;
Temperature;
Number of disconnects and reconnects; and
Power factor of the load.

20. A method as claimed in claim 18, wherein if the connecting source lags the disconnecting source, Td2=N+Tps, where N=an integer>= the number of S2 cycles required to reconnect the load and the controller predicts N based on measured parameters.

21. A method as claimed in claim 18, wherein if the connecting source leads the disconnecting source, Td2=N+Tps+(1/fc)−(2*Tdis1), where N=an integer>=the number of S2 cycles required to reconnect the load, and the controller predicts N based on measured parameters.

22. A method as claimed in claim 18, wherein a controller calculates or refers to a look-up table to determine the delay for each cycle from the first full cycle after reconnect is initiated until the load is fully reconnected after the twentieth cycle.

23. A method of connecting a load to a source, comprising the steps of:

determining delay intervals based on volt-second characteristics of a load; and
connecting an AC source to the load following said delay intervals,
wherein when a magnetic device is randomly disconnected from a source without any knowledge of the applied volt-seconds before disconnection, minimization of the in-rush current is accomplished by:
reconnection of the load to the source so that there is only 5% of the rated cycle volt-seconds applied for the first two ½ cycles;
after the first two ½ cycles, 5% more volt-seconds are added for each subsequence two ½ cycles; and
after 20 cycles (40 ½ cycles) the applied volt-seconds will be 100.

24. A method as claimed in claim 23, wherein VSrs=Aoc/Wc*(−cos (Finish time)+cos (start time)), and:

VSrs=volt-seconds of an ½ cycle sine wave;
Aoc=the peak value, in volts, of the sine wave form of the connecting source;
Wc=omega=2*(pi)*Fc; Fc= connecting source frequency; and
the finish time is 1/(2*Fc).

25. A method as claimed in claim 24, wherein VSrs=Aoc/Wc*(1+cos (Wc*Td)); Td=delay period from the start of the ½ cycle; VSrs should be N*5%*2*Aoc/Wc; N ranges from 1 to 20 cycles; Td=1/Wc*ACos[N*0.1−1]; Td=1/Wc*ACos [−0.9]=7.136 Ms for the first cycle; Td=1/Wc*ACos (1.8−1)=1.70 Ms for the eighteenth cycle; and Td=0 for the twentieth cycle.

26. A device for connecting a load to a source, comprising:

means for determining delay intervals based on volt-second characteristics of a load; and
means for connecting an AC source to the load following said delay intervals,
wherein said load is disconnected from disconnecting source S1 and connected to connecting source S2 after said delay intervals, and wherein said volt-seconds are determined based on current and voltage measurements during disconnection of source S1 from said load, and
wherein said volt-seconds are determined, for delay times Td1, Td2, and Td3, according to the equality VSd+VSc1+VSc2+VSc3=2*Aoc/Wc, where:
Td1 is the delay from the load disconnection point to the reconnection in first ½ cycle of the connecting source that occurs after disconnection;
Td2 is the delay from the load disconnection to the reconnection in second ½ cycle of the connecting source that occurs after disconnection;
Td3 is the delay from the first cross over of the third ½ cycle to the reconnection in third ½ cycle of the connecting source that occurs after disconnection;
VSc1=volt-seconds of the first ½ cycle of the connecting source after load reconnection to the end of the ½ cycle;
VSc2=volt-seconds of the second ½ cycle of the connecting source after load reconnection to the end of the ½ cycle;
VSc3=volt-seconds of the third ½ cycle of the connecting source after load reconnection to the end of the ½ cycle;
Aoc=peak value, in volts, of the sine wave form of the connecting source;
Wc=omega=2*(PI)*Foc; Foc=connecting source frequency;
Aod=peak value, in volts, of the sine wave form of the disconnecting source;
Wd=omega=2*(PI)*Fod; Fod=disconnecting source frequency.

* * * * *